(12) United States Patent
Kawakami et al.

(10) Patent No.: US 8,765,867 B2
(45) Date of Patent: Jul. 1, 2014

(54) HEAT-RESISTANT RESIN PASTE AND METHOD FOR PRODUCING SAME

(75) Inventors: Hiroyuki Kawakami, Ichihara (JP);
Reiko Yamaguchi, Chiba (JP);
Yoshihiro Nomura, Oyama (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 1877 days.

(21) Appl. No.: 11/573,959

(22) PCT Filed: Sep. 28, 2004

(86) PCT No.: PCT/JP2004/014172
§ 371 (c)(1),
(2), (4) Date: Dec. 16, 2008

(87) PCT Pub. No.: WO2006/035495
PCT Pub. Date: Apr. 6, 2006

(65) Prior Publication Data
US 2009/0088536 A1    Apr. 2, 2009

(51) Int. Cl.
*C08G 69/26* (2006.01)
*C08K 5/00* (2006.01)
*C08L 77/00* (2006.01)

(52) U.S. Cl.
USPC .......................... 524/538; 524/87; 525/432

(58) Field of Classification Search
CPC ........ C08L 77/00; C08L 77/06; C08L 77/02; C08G 69/00; C08K 5/3437; C08K 5/18; C08K 5/0091
USPC ............... 524/86, 87, 538; 525/432
See application file for complete search history.

(56) References Cited

U.S. PATENT DOCUMENTS

| | | | |
|---|---|---|---|
| 5,037,862 A | 8/1991 | Nishizawa et al. | |
| 5,087,658 A * | 2/1992 | Nishizawa et al. | 524/538 |
| 7,061,081 B2 | 6/2006 | Yano et al. | |
| 2003/0082925 A1 | 5/2003 | Yano et al. | |
| 2006/0180908 A1 | 8/2006 | Yano et al. | |

FOREIGN PATENT DOCUMENTS

| | | |
|---|---|---|
| CN | 1416452 A | 5/2003 |
| EP | 0 384 036 | 8/1990 |
| JP | 63-309523 | 12/1988 |

(Continued)

OTHER PUBLICATIONS

Korean Official Action issued on Oct. 9, 2008, in Application No. 10-2007-7005208.
Taiwanese Official Action issued on Mar. 18, 2010, for Application No. 093129555.
Chinese Official Action issued on Mar. 28, 2008, in Application No. 200480000715.1.

(Continued)

*Primary Examiner* — Bijan Ahvazi
*Assistant Examiner* — Atnaf Admasu
(74) *Attorney, Agent, or Firm* — Antonelli, Terry, Stout & Kraus, LLP.

(57) ABSTRACT

An object of the present invention is to provide a heat-resistant resin paste that enables the formation of a precise pattern, exhibits excellent adhesiveness, heat resistance and flexibility, and enables a shortening of the production time, as well as a method for producing thereof. The present invention relates to a heat-resistant resin paste, comprising a first organic solvent (A1), a second organic solvent (A2) that comprises a lactone, a heat-resistant resin (B) that is soluble in a mixed organic solvent of (A1) and (A2), and a heat-resistant resin filler (C) that is soluble in (A1) but insoluble in (A2), wherein (C) is dispersed within a solution comprising (A1), (A2) and (B).

11 Claims, 1 Drawing Sheet

(56) References Cited

FOREIGN PATENT DOCUMENTS

| | | |
|---|---|---|
| JP | 64-036649 | 2/1989 |
| JP | 04-153261 | 5/1992 |
| JP | 08-120075 | 5/1996 |
| JP | 2697215 | 9/1997 |
| JP | 09-328549 | 12/1997 |
| JP | 3087290 | 7/2000 |
| JP | 2001-264771 | 9/2001 |
| KR | 1995-0003189 | 4/1995 |
| WO | WO 01/66645 A1 | 9/2001 |

OTHER PUBLICATIONS

Taiwanese Official Action issued on Sep. 14, 2009, for Application No. 09820572480.

Japanese Official Action issued on Nov. 9, 2010, for JP Application No. 2006-537589.

Taiwanese Official Action issued on Sep. 10, 2010, for Application No. 09920648330.

Philippine Official Action dated Feb. 24, 2011, for Philippine Application No. 1-2007-500362.

* cited by examiner

HEAT-RESISTANT RESIN PASTE AND METHOD FOR PRODUCING SAME

TECHNICAL FIELD

The present invention relates to a heat-resistant resin paste that exhibits excellent adhesiveness, heat resistance, flexibility and workability, as well as a method for producing thereof.

BACKGROUND ART

Heat-resistant resins such as polyimide resins exhibit superior heat resistance and mechanical properties, and are consequently already in widespread use in the electronics field as surface protection films and interlayer insulating films for semiconductor elements. In recent years, screen printing methods and dispensing methods that do not require complex steps such as exposure, developing, and etching and the like are attracting considerable attention as image formation methods for polyimide-based resin films used as surface protection films, interlayer insulating films and stress relaxation materials.

Screen printing methods and dispensing methods typically use a heat-resistant resin paste with thixotropic properties that contains a base resin, a filler, and a solvent as components. Almost all of the heat-resistant resin pastes that have been developed to date have used a silica filler or an insoluble polyimide filler as a thixotropy-imparting filler, and as a result, large numbers of residual voids or air bubbles are left at the filler interface upon heating and drying, causing problems that include a deterioration in the film strength and inferior electrical insulation properties.

In order to overcome these problems, heat-resistant resin pastes that are capable of forming polyimide patterns with excellent properties have been developed by employing a special combination of an organic filler (soluble filler), a base resin, and a solvent in which the filler first dissolves upon heating and drying, and subsequently forms a co-soluble phase with the base resin to form a film (see Japanese Patent Publication No. 2,697,215 and Japanese Patent Publication No. 3,087,290).

DISCLOSURE OF INVENTION

However, although the heat-resistant resin pastes described above include no residual voids or air bubbles at the filler interface upon heating and drying, and therefore exhibit excellent film density and electrical insulation properties, the production process of the heat-resistant resin pastes requires synthesis of an organic filler (the soluble filler), and subsequent addition of a solution containing this organic filler (soluble filler) dissolved therein to a poor solvent, thereby precipitating the organic filler (soluble filler), meaning the preparation of the organic filler (soluble filler) requires considerable time, and requires further improvements in workability.

Accordingly, an object of the present invention is to provide a heat-resistant resin paste that enables the formation of a precise pattern, exhibits excellent adhesiveness, heat resistance and flexibility, and enables a shortening of the production time, as well as a method for producing thereof.

The present invention provides a heat-resistant resin paste that exhibits excellent adhesiveness, heat resistance and flexibility, in which thixotropic properties are imparted to the heat-resistant resin paste, and which is capable of forming a precise pattern by screen printing or dispensing methods, by using a heat-resistant resin filler that is soluble in a first solvent but insoluble in a second solvent. More specifically, the present invention relates to a heat-resistant resin paste in which, by selecting an organic solvent comprising a lactone as the second organic solvent, the preparation of the heat-resistant resin filler and the production of the heat-resistant resin paste can be conducted within the same solvent in a comparatively short period of time, thus enabling an improvement in the productivity for producing the heat-resistant resin paste.

In other words, the present invention relates to a heat-resistant resin paste comprising a first organic solvent (A1), a second organic solvent (A2) that comprises a lactone, a heat-resistant resin (B) that is soluble in a mixed organic solvent of (A1) and (A2), and a heat-resistant resin filler (C) that is soluble in (A1) but insoluble in (A2), wherein (C) is dispersed within a solution comprising (A1), (A2) and (B).

Furthermore, the present invention also relates to the heat-resistant resin paste described above, wherein the first organic solvent (A2) comprises a nitrogen-containing compound.

Furthermore, the present invention also relates to the heat-resistant resin paste described above, wherein the nitrogen-containing compound is a heterocyclic nitrogen-containing compound.

Furthermore, the present invention also relates to the heat-resistant resin paste described above, wherein the lactone is either γ-butyrolactone or γ-valerolactone.

Furthermore, the present invention also relates to the heat-resistant resin paste described above, wherein the heat-resistant resin (B) and the heat-resistant resin filler (C) are polyimide resins or precursors thereto.

Furthermore, the present invention also relates to the heat-resistant resin paste described above, wherein the heat-resistant resin (B) and/or the heat-resistant resin filler (C) is a polyimide resin or precursor thereto obtained by reaction between: a diamine comprising an aromatic diamine represented by a general formula (I) shown below:

[Formula 1]

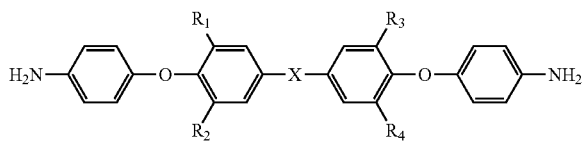

(I)

(wherein, $R_1$, $R_2$, $R_3$ and $R_4$ each represent, independently, a hydrogen atom, an alkyl group of 1 to 9 carbon atoms, an alkoxy group of 1 to 9 carbon atoms, or a halogen atom, and X represents a single bond, —O—, —S—, —SO$_2$—, —C(=O)—, —S(=O)—, or a group represented by a formula shown below)

[Formula 2]

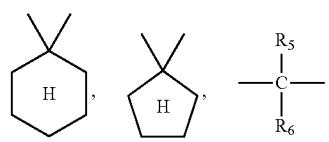

(wherein, $R_5$ and $R_6$ each represent, independently, a hydrogen atom, alkyl group, trifluoromethyl group, trichloromethyl group, halogen atom, or phenyl group), and/or a diamine comprising an aromatic diamine represented by a general formula (II) shown below:

[Formula 3]

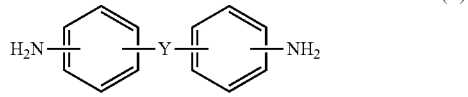

(II)

(wherein, Y represents —O—, —C(=O)—, —S(=O)—, or a group represented by a formula shown below);

[Formula 4]

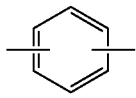

and a tetracarboxylic acid comprising an aromatic tetracarboxylic dianhydride represented by a general formula (III) shown below or a derivative thereof:

[Formula 5]

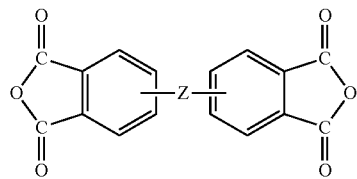

(III)

(wherein, Z represents a single bond, —O—, —S—, —$SO_2$—, —C(=O)—, or —S(=O)—).

Furthermore, the present invention also relates to the heat-resistant resin paste described above, wherein the thixotropic index of the heat-resistant resin paste is 1.5 or higher.

Furthermore, the present invention also relates to the heat-resistant resin paste described above, wherein the heat-resistant resin filler (C) is a filler that is prepared within the second organic solvent (A2).

Furthermore, the present invention also relates to a method for producing the heat-resistant resin paste described above, wherein the heat-resistant resin filler (C) is prepared within a second organic solvent (A2) that comprises a lactone.

BEST MODE FOR CARRYING OUT THE INVENTION

Figure 1:
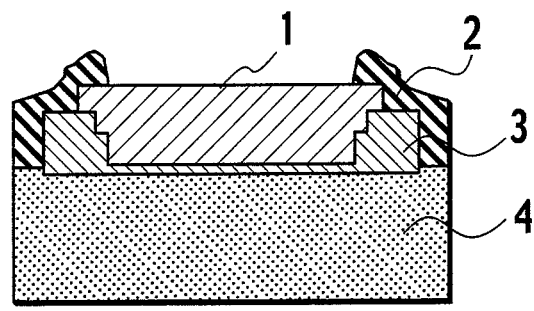
FIG. 1 is a cross-sectional view showing an example of a diode that uses a heat-resistant resin paste of the present invention as an insulating film. In the figure, 1 represents an electrode, 2 represents the insulating film, 3 represents an oxide film, and 4 represents a chip.

As follows is a more detailed description of a heat-resistant resin paste of the present invention.

A heat-resistant resin paste of the present invention comprises a first organic solvent (A1), a second organic solvent (A2) that comprises a lactone, a heat-resistant resin (B) that is soluble in a mixed organic solvent of (A1) and (A2), and a heat-resistant resin filler (C) that is soluble in (A1) but insoluble in (A2).

(A1) First Organic Solvent

There are no particular restrictions on the first organic solvent (A1) used in the present invention, provided that when the solvent is used as a mixed solvent with the second organic solvent (A2), the mixed solvent dissolves the heat-resistant resin (B) but does not dissolve the heat-resistant resin filler (C), and provided that the first organic solvent (A1) alone dissolves the heat-resistant resin filler (C). The first organic solvent (A1) alone preferably also dissolves the heat-resistant resin (B). Specific examples of (A1) include ether-based compounds such as diethylene glycol dimethyl ether, diethylene glycol diethyl ether, triethylene glycol dimethyl ether and triethylene glycol diethyl ether, sulfur-containing compounds such as dimethylsulfoxide, diethylsulfoxide, dimethylsulfone and sulfolane, ester-based compounds such as cellosolve acetate, ketone-based compounds such as cyclohexanone, and methyl ethyl ketone, nitrogen-containing compounds such as N-methylpyrrolidone, N,N'-dimethylacetamide, N,N'-dimethylformamide, 1,3-dimethyl-3,4,5,6-tetrahydro-2(1H)-pyrimidinone, 1,3-dimethyl-2-imidazolidinone and various amines, and aromatic hydrocarbon-based compounds such as toluene and xylene, and these compounds may be used either alone, or in combinations of two or more different compounds.

The first organic solvent (A1) used in the present invention preferably comprises a nitrogen-containing compound. There are no particular restrictions on the nitrogen-containing compound, and suitable examples include the aforementioned N-methylpyrrolidone, N,N'-dimethylacetamide, N,N'-dimethylformamide, 1,3-dimethyl-3,4,5,6-tetrahydro-2(1H)-pyrimidinone, 1,3-dimethyl-2-imidazolidinone and various amines, although heterocyclic nitrogen-containing compounds are preferred as they offer particularly superior dissolution properties.

The heterocyclic nitrogen-containing compound, namely the heterocyclic polar solvent, preferably dissolves both the heat-resistant resin (B) and the heat-resistant resin filler (C), and specific examples of heterocyclic solvents that can be used include N-methylpyrrolidone, 1,3-dimethyl-3,4,5,6-tetrahydro-2(H1)-pyrimidinone and 1,3-dimethyl-2-imidazolidinone. When selecting the solvent, selection of a solvent for which the values for the solubility parameter and the polarity parameter are similar to those of the dissolution target material is preferred.

The quantity used of the heterocyclic nitrogen-containing compound preferably represents at least 40% by weight, even more preferably at least 50% by weight, and most preferably 60% by weight or more of the combined weight of the first organic solvent (A1) and the lactone-containing second organic solvent (A2) described below. If the quantity of the heterocyclic nitrogen-containing compound is less than 40% by weight, then the solubility of the heat-resistant resin (B) and the heat-resistant resin filler (C) (both of which are described below) deteriorates, which tends to cause a deterioration in the characteristics of the produced coating film.

(A2) Second Organic Solvent that Comprises a Lactone

The second organic solvent (A2) used in the present invention is an organic solvent that comprises a lactone, and is either a lactone or a mixed solvent of a lactone and another solvent. There are no particular restrictions on the second organic solvent (A2) provided that when the solvent is used as a mixed solvent with the first organic solvent (A1), the mixed solvent dissolves the heat-resistant resin (B) but does not dissolve the heat-resistant resin filler (C), and provided that the second organic solvent (A2) alone does not dissolve the heat-resistant resin filler (C). In the present invention, the quantity used of the lactone, relative to the total weight of the second organic solvent (A2), is preferably at least 5% by weight, and is even more preferably within a range from 5 to 95% by weight, even more preferably from 10 to 90% by weight, even more preferably from 15 to 90% by weight, and most preferably from 15 to 85% by weight. Provided the quantity used of the lactone is at least 5% by weight, the thixotropic properties of the obtained paste fall within a range that ensures favorable handling characteristics for the paste, and provided the quantity is no greater 95% by weight, the solubility of the heat-resistant resin (B) and the heat-resistant resin filler (C) are less likely to deteriorate, meaning deterioration in the characteristics of the produced coating film can be more readily prevented.

Examples of suitable lactones include γ-butyrolactone, γ-valerolactone, γ-caprolactone, γ-heptalactone, α-acetyl-γ-butyrolactone, and ε-caprolactone, and these lactones may be used either alone, or in combinations of two or more different compounds. Of these lactones, if due consideration is given to the usable time period during application of the heat-resistant resin paste, then high boiling point lactones such as γ-butyrolactone and γ-valerolactone are preferred.

In those cases where a mixed solvent of a lactone and another solvent is used as the second organic solvent (A2), there are no particular restrictions on the other solvent mixed with the lactone, provided the solvent is co-soluble with the lactone, and examples of suitable solvents include ether-based compounds such as diethylene glycol dimethyl ether, diethylene glycol diethyl ether, triethylene glycol dimethyl ether and triethylene glycol diethyl ether, sulfur-containing compounds such as dimethylsulfoxide, diethylsulfoxide, dimethylsulfone and sulfolane, ester-based compounds such as cellosolve acetate, ketone-based compounds such as cyclohexanone, and methyl ethyl ketone, nitrogen-containing compounds such as N-methylpyrrolidone, dimethylacetamide and 1,3-dimethyl-3,4,5,6-tetrahydro-2(1H)-pyrimidinone, and aromatic hydrocarbon-based compounds such as toluene and xylene, and these solvents may be used either alone, or in combinations of two or more different solvents.

In consideration of the usable time period during application of the heat-resistant resin paste, the boiling points of the organic solvents (A1) and (A2) used in the present invention are preferably 100° C. or higher. Furthermore, the boiling point of the mixed solvent of (A1) and (A2) is preferably within a range from 100 to 250° C.

(B) Heat-Resistant Resin

There are no particular restrictions on the soluble heat-resistant resin (B) of the present invention, provided the resin is soluble in the mixed solvent of (A1) and (A2), and is preferably soluble at any temperature within a range from −25° C. to 150° C. Specific examples of suitable resins include polyimide resins, polyamideimide resins and polyamide resins, although of these, polyimide resins and precursors thereto are preferred in terms of the heat resistance, etc. The heat-resistant resin (B) is preferably soluble in the first organic solvent (A1) alone, and is even more preferably soluble at any temperature within a range from −25° C. to 150° C. The heat-resistant resin (B) may be insoluble in the second organic solvent (A2) alone.

As follows is a more detailed description of polyimide resins and the precursors thereto. Examples of methods for obtaining the above polyimide resins or precursors thereto include methods in which a diamine comprising an aromatic, aliphatic or alicyclic diamine compound is reacted with a tetracarboxylic acid comprising a tetracarboxylic dianhydride or derivative thereof, and this reaction can be conducted in the presence of an organic solvent. The reaction temperature is preferably within a range from 25° C. to 250° C., and the reaction time can be selected appropriately in accordance with factors such as the scale of the batch and the reaction conditions employed.

There are no particular restrictions on the diamine comprising an aromatic, aliphatic or alicyclic diamine compound, or the tetracarboxylic acid comprising a tetracarboxylic dianhydride or derivative thereof that are used in preparing an aforementioned polyimide resin or precursor thereto, although if due consideration is given to solubility within the mixed solvent of the first organic solvent (A1) and the second organic solvent (A2) that comprises a lactone, then the use of a compound represented by a general formula (I) and/or a general formula (II) shown below as the diamine is preferred.

[Formula 6]

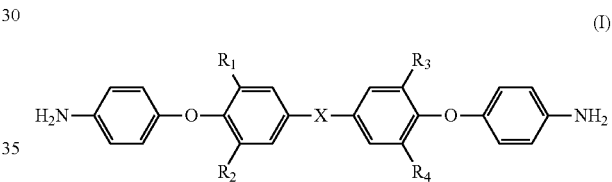

(I)

(wherein, $R_1$, $R_2$, $R_3$ and $R_4$ each represent, independently, a hydrogen atom, an alkyl group of 1 to 9 carbon atoms, an alkoxy group of 1 to 9 carbon atoms, or a halogen atom, and X represents a single bond, —O—, —S—, —SO$_2$—, —C(=O)—, —S(=O)—, or a group represented by a formula shown below)

[Formula 7]

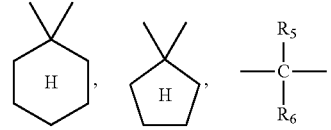

(wherein, $R_5$ and $R_6$ each represent, independently, a hydrogen atom, alkyl group, trifluoromethyl group, trichloromethyl group, halogen atom, or phenyl group).

The general formula (II) is shown below.

[Formula 8]

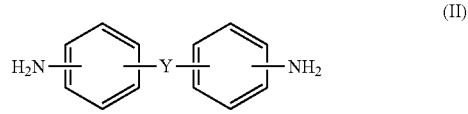

(II)

(wherein, Y represents —O—, —C(=O)—, —S(=O)—, or a group represented by a formula shown below)

[Formula 9]

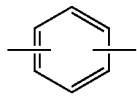

Specific examples of compounds of the above general formula (I) include 2,2-bis[4-(4-aminophenoxy)phenyl]propane, 2,2-bis[3-methyl-4-(4-aminophenoxy)phenyl]propane, 2,2-bis[4-(4-aminophenoxy)phenyl]butane, 2,2-bis[3-methyl-4-(4-aminophenoxy)phenyl]butane, 2,2-bis[3,5-dimethyl-4-(4-aminophenoxy)phenyl]butane, 2,2-bis[3,5-dibromo-4-(4-aminophenoxy)phenyl]butane, 1,1,1,3,3,3-hexafluoro-2,2-bis[4-(4-aminophenoxy)phenyl]propane, 1,1,1,3,3,3-hexafluoro-2,2-bis[3-methyl-4-(4-aminophenoxy)phenyl]propane, 1,1-bis[4-(4-aminophenoxy)phenyl]cyclohexane, 1,1-bis[4-(4-aminophenoxy)phenyl]cyclopentane, bis[4-(4-aminophenoxy)phenyl]sulfone, bis[4-(4-aminophenoxy)phenyl]ether, 4,4'-carbonylbis(p-phenyleneoxy)dianiline and 4,4'-bis(4-aminophenoxy)biphenyl, and of these, 2,2-bis[4-(4-aminophenoxy)phenyl]propane is the most preferred.

Specific examples of compounds of the above general formula (II) include 4,4'-diaminodiphenylsulfone, 3,3'-diaminodiphenylsulfone, 3,4'-diaminodiphenylsulfone, 4,4'-diaminodiphenyl ether, 3,3'-diaminodiphenyl ether, 3,4'-diaminodiphenyl ether, 3,4'-diaminobiphenyl, 4,4'-diaminobenzophenone, 3,3'-diaminobenzophenone and 1,4-bis(4'-aminophenyl)benzene, and of these, 4,4'-diaminodiphenyl ether is the most preferred.

In the present invention, the aromatic diamine compound represented by the general formula (I) and/or the general formula (II) preferably represents from 1 to 100 mol %, and even more preferably from 2 to 100 mol %, and most preferably from 5 to 100 mol %, of the total weight of the diamine compound.

In the present invention, aromatic diamines other than those represented by the above general formula (I) may also be used, and suitable examples of such diamines include m-phenylenediamine, p-phenylenediamine, diamino-m-xylylene, diamino-p-xylylene, 1,4-naphthalenediamine, 2,6-naphthalenediamine and 2,7-naphthalenediamine.

Moreover, examples of other diamine compounds that can be used besides the aforementioned aromatic diamine compounds as the diamines include aliphatic diamines and diaminosiloxanes, etc., such as 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,3-bis(3-aminopropyl)tetramethyldisiloxane and 1,3-bis(3-aminopropyl)tetramethylpolysiloxane.

These diamines may be used either alone, or in combinations of two or more different compounds.

The tetracarboxylic dianhydride or derivative thereof is preferably an aromatic tetracarboxylic dianhydride represented by a general formula (III) shown below or a derivative thereof:

[Formula 10]

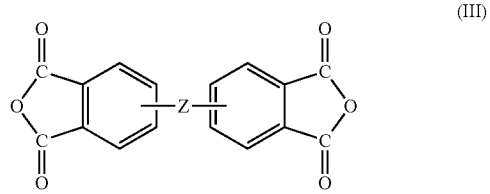

(wherein, Z represents a single bond, —O—, —S—, —SO$_2$—, —C(=O)—, or —S(=O)—).

Specific examples of compounds represented by the above general formula (II) include tetracarboxylic dianhydrides such as 3,3',4,4'-biphenyltetracarboxylic dianhydride, 2,2',3,3'-biphenyltetracarboxylic dianhydride, 2,3,3',4'-biphenyltetracarboxylic dianhydride, bis(3,4-dicarboxyphenyl)sulfone dianhydride, bis(3,4-dicarboxyphenyl)ether dianhydride, 3,4,3',4'-benzophenonetetracarboxylic dianhydride, 2,3,2',3'-benzophenonetetracarboxylic dianhydride and 2,3,3',4'-benzophenonetetracarboxylic dianhydride, as well as derivatives of these dianhydrides, and of these, the use of 3,3',4,4'-benzophenonetetracarboxylic dianhydride is preferred.

These dicarboxylic acids may be used either alone, or in combinations of two or more different compounds.

There are no particular restrictions on the organic solvent used in the preparation of the polyimide resin or precursor thereto that functions as the heat-resistant resin (B), and suitable solvents include ether-based compounds such as diethylene glycol dimethyl ether, diethylene glycol diethyl ether, triethylene glycol dimethyl ether and triethylene glycol diethyl ether, sulfur-containing compounds such as dimethylsulfoxide, diethylsulfoxide, dimethylsulfone and sulfolane, ester-based compounds such as γ-butyrolactone and cellosolve acetate, ketone-based compounds such as cyclohexanone and methyl ethyl ketone, nitrogen-containing compounds such as N-methylpyrrolidone, N,N'-dimethylacetamide, N,N'-dimethylformamide, 1,3-dimethyl-3,4,5,6-tetrahydro-2(1H)-pyrimidinone, 1,3-dimethyl-2-imidazolidinone and various amines, and aromatic hydrocarbon-based compounds such as toluene and xylene, and although these solvents may be used either alone, or in combinations of two or more different solvents, in order to enable subsequent conversion to a heat-resistant resin paste, the use of the first organic solvent (A1) is preferred.

In the present invention, the heat-resistant resin (B) preferably has a number average molecular weight, determined by gel permeation chromatography (GPC), that falls within a range from 1,000 to 200,000, even more preferably from 2,000 to 180,000, and most preferably from 3,000 to 160,000.

(C) Heat-Resistant Resin Filler

The heat-resistant resin filler (C) is insoluble in the mixed solvent of (A1) and (A2), and is preferably insoluble at least one point within a range from −25° C. to 250° C. Furthermore, the heat-resistant resin filler (C) is soluble in the first organic solvent (A1) alone, and is preferably soluble at least one point within a range from −25° C. to 250° C. Moreover, the heat-resistant resin filler (C) is insoluble in the second organic solvent (A2) alone, and is preferably insoluble at least one point within a range from −25° C. to 250° C. Provided the filler meets these requirements, there are no other particular restrictions on the heat-resistant resin filler (C), and specific examples of suitable fillers include resin fillers comprising polyimide resins, polyamideimide resins, polyamide resins, or precursors thereto, which can be selected appropriately in accordance with the solvents used. Of the various possibilities, polyimide resins or precursors thereto are preferred in terms of their heat resistance.

Next is a detailed description of the resin filler comprising a polyimide resin or precursor thereto. Examples of methods of obtaining the polyimide resin or precursor thereto that functions as the heat-resistant resin filler include methods in which a diamine comprising an aromatic, aliphatic or alicyclic diamine compound is reacted with a dicarboxylic acid comprising a tetracarboxylic dianhydride or derivative thereof, and this reaction can be conducted in the presence of an organic solvent. The reaction temperature is preferably within a range from 10° C. to 120° C., and even more preferably from 15° C. to 100° C. If the reaction temperature is less than 10° C., then the reaction tends not to proceed satisfactorily, whereas if the temperature exceeds 120° C., then precipitation of the filler tends to be inadequate. The reaction time can be selected appropriately in accordance with factors such as the scale of the batch and the reaction conditions employed.

There are no particular restrictions on the diamine and dicarboxylic acid used, and the same compounds as those used for the heat-resistant resin (B) can be used.

There are no particular restrictions on the organic solvent used during preparation of the polyimide resin or precursor thereto that functions as the heat-resistant resin filler (C), and the same solvents as those used for the heat-resistant resin (B) can be used, although in order to enable subsequent conversion to a heat-resistant resin paste, the use of the second organic solvent (A2) is preferred.

In the present invention, the heat-resistant resin filler (C) preferably has a number average molecular weight, determined by gel permeation chromatography (GPC), that falls within a range from 1,000 to 200,000, even more preferably from 2,000 to 180,000, and most preferably from 3,000 to 160,000.

The mixing ratio between the heat-resistant resin (B) and the heat-resistant resin filler (C), reported as a weight ratio, is preferably within a range from 10/90 to 90 to 10, even more preferably from 15/85 to 85/15, and is most preferably from 20/80 to 80/20.

(Characteristics of Resin Paste)

The thixotropic index of a heat-resistant resin paste of the present invention is 1.5 or higher, and preferably 1.6 or higher, even more preferably 1.7 or higher, and is most preferably 1.8 or higher. The thixotropic index of the heat-resistant resin paste is measured at a measurement temperature of 25° C., using an E-type viscometer (RE-80U, manufactured by Tokyo Keiki Co., Ltd.) and a sample size of 0.2 g. The thixotropic index is represented by the ratio $\eta_1/\eta_{10}$ between the apparent viscosity values $\eta_1$ and $\eta_{10}$ measured at rotation rates of 1 rpm and 10 rpm respectively. Ensuring that the thixotropic index is 1.5 or higher enables favorable printing or coating characteristics to be more readily obtained.

The viscosity of the heat-resistant resin paste (measured at 0.5 rpm: $\eta_{0.5}$) preferably falls within a range from 1 to 1,000 Pa·s, even more preferably from 3 to 900 Pa·s, and most preferably from 3 to 800 Pa·s. If the viscosity of the heat-resistant resin paste is less than 1 Pa·s, then the paste tends to be prone to sagging following printing or coating, whereas if the viscosity exceeds 1,000 Pa·s, then the workability of the paste tends to deteriorate.

The concentration of the heat-resistant resin (B) and heat-resistant resin filler (C) within the heat-resistant resin paste is preferably within a range from 5 to 90% by weight, even more preferably from 10 to 90% by weight, and most preferably from 10 to 80% by weight. If this concentration is less than 5% by weight, then achieving a thicker film for the product coating tends to become more difficult, whereas if the concentration exceeds 90% by weight, there is a danger of a loss in the fluidity of the paste, which tends to cause a deterioration in the workability.

The heat-resistant resin paste of the present invention may also include, if required, antifoaming agents, pigments, dyes, plasticizers, antioxidants, coupling agents, and resin modifiers and the like.

(Production Method)

According to one embodiment of the present invention, there is provided a method for producing a heat-resistant resin paste that offers excellent workability, wherein the heat-resistant resin filler (C) can be prepared within the second organic solvent (A2) that comprises a lactone.

A heat-resistant resin paste of the present invention is preferably obtained by mixing together an organic solvent solution of a heat-resistant resin (B) that is soluble in a first organic solvent (A1), and an organic solvent dispersion of a heat-resistant resin filler (C) that is insoluble in a second organic solvent (A2). The mixing is preferably conducted at a temperature within a range from 10 to 180° C., and even more preferably from 15 to 160° C. If the mixing temperature is less than 10° C., then the heat-resistant resin solution and the heat-resistant resin filler dispersion tend not to mix satisfactorily, whereas if the temperature exceeds 180° C., the heat-resistant resin filler tends to dissolve in the organic solvent, and either result tends to result in a deterioration in the printing or coating characteristics.

The polyimide resin or precursor thereto that functions as the heat-resistant resin filler (C) is preferably synthesized by a reaction conducted within the second organic solvent (A2) that comprises a lactone. The quantity used of the lactone, relative to the total weight of the organic solvent used in the reaction, is preferably within a range from 5 to 95% by weight, even more preferably from 10 to 90% by weight, even more preferably from 15 to 90% by weight, and most preferably from 15 to 85% by weight. If the quantity used of the lactone is less than 5% by weight, then precipitation of the heat-resistant organic filler tends to take considerable time, causing a deterioration in the workability, whereas if the quantity exceeds 95% by weight, then synthesis of the heat-resistant resin filler tends to become more difficult. Furthermore, the polyimide resin or precursor thereto that functions as the heat-resistant resin (B) is preferably synthesized by a reaction conducted within the first organic solvent (A1).

There are no particular restrictions on the method used for converting the polyimide resin precursor to a polyimide resin via a cyclodehydration, and typical methods can be used. Examples of suitable methods that can be used include thermal cyclization methods in which the cyclodehydration is effected by heating either at normal pressure or under reduced pressure, and chemical cyclization methods in which a dehydrating agent such as acetic anhydride or the like is used, either in the presence or absence of a catalyst. In the case of a thermal cyclization method, the reaction is preferably conducted while the water generated by the dehydration reaction is removed from the system. During this process, the reaction solution is preferably heated to a temperature within a range from 80 to 400° C., and preferably from 100 to 250° C. In such cases, the water may be removed by azeotropic distillation, by using a solvent such as benzene, toluene or xylene or the like that forms an azeotrope with water.

In the case of a chemical cyclization method, the reaction is conducted in the presence of a chemical dehydrating agent, at a temperature within a range from 0 to 120° C., and preferably from 10 to 80° C. Examples of preferred chemical dehydrating agents include acid anhydrides such as acetic anhydride, propionic anhydride, butyric anhydride or benzoic anhydride, or a carbodiimide compound such as dicyclohexylcarbodiimide. During this reaction, a substance that promotes the cyclization reaction, such as pyridine, isoquinoline, trimethylamine, triethylamine, aminopyridine or imidazole, is preferably also added. The chemical dehydrating agent is typically used in a quantity within a range from 90 to 600 mol % relative to the total weight of the diamine compound, whereas the substance that promotes the cyclization reaction is used in a quantity within a range from 40 to 300 mol % relative to the total weight of the diamine compound. Dehydration catalysts, including phosphorus compounds such as triphenyl phosphite, tricyclohexyl phosphite, triphenyl phosphate, phosphoric acid or phosphorus pentoxide, and boron compounds such as boric acid or boric anhydride may also be used. In terms of reducing the quantity of residual ionic impurities, the aforementioned thermal cyclization method is preferred.

A heat-resistant resin paste of the present invention exhibits excellent adhesiveness, heat resistance and workability. By using a lactone as the second organic solvent, the productivity associated with producing the heat-resistant resin paste can be improved dramatically. Moreover, a heat-resistant resin paste of the present invention can be used for forming a precise pattern using screen printing or dispensing methods, and a semiconductor device produced using a heat-resistant resin paste of the present invention exhibits favorable properties.

EXAMPLES

As follows is a detailed description of the present invention based on a series of examples, although the present invention is in no way limited to these examples.

Synthesis Example 1

Synthesis of a Solution of a Heat-Resistant Resin (B)

A 1 liter four-necked flask fitted with a thermometer, a stirrer, a nitrogen gas inlet, and a condenser fitted with an oil-water separator was flushed with a nitrogen stream, while the flask was charged with 96.7 g (0.3 mols) of 3,4,3',4'-benzophenonetetracarboxylic dianhydride (hereafter abbreviated as BTDA), 55.4 g (0.285 mols) of 4,4'-diaminodiphenyl ether (hereafter abbreviated as DDE), 3.73 g (0.015 mols) of 1,3-bis(3-aminopropyl)tetramethyldisiloxane (hereafter referred to as LP-7100), and 363 g of 1,3-dimethyl-3,4,5,6-tetrahydro-2(1H)-pyrimidinone (hereafter abbreviated as DMPU), and following stirring for approximately 6 hours at a temperature of 70 to 90° C., the reaction mixture was cooled to halt the reaction, yielding a heat-resistant resin solution (PI-1) with a number average molecular weight (measured using a GPC method, and calculated against a calibration curve produced using standard polystyrenes) of 25,000.

Example 1

Synthesis of a Solution of a Heat-Resistant Resin Filler (C)

An identical flask to that used in the synthesis example 1 was charged with 96.7 g (0.3 mols) of BTDA, 61.5 g (0.15 mols) of 2,2-bis[4-(4-aminophenoxy)phenyl]propane (hereafter abbreviated as BAPP), 27.0 g (0.135 mols) of DDE, 3.73 g (0.015 mols) of LP-7100, 133.25 g of DMPU, and 308.59 g of γ-butyrolactone hereafter abbreviated as γ-BL), and when the mixture was stirred for 5 hours at 70 to 90° C., a polyimide precursor filler with a number average molecular weight of 24,000 precipitated out from the solution. Subsequently, the reaction mixture was cooled to halt the reaction, yielding a heat-resistant resin filler solution (PIF-1). The thus obtained heat-resistant resin filler was soluble in DMPU.

Example 2

Synthesis of a Solution of a Heat-Resistant Resin Filler (C)

An identical flask to that used in the synthesis example 1 was charged with 80.5 g (0.25 mols) of BTDA, 97.38 g (0.2375 mols) of BAPP, 3.11 g (0.0125 mols) of LP-7100, 295.62 g of γ-BL, and 126.69 g of DMPU, and when the mixture was reacted in exactly the same manner as the example 1, a polyimide precursor filler with a number average molecular weight of 25,000 precipitated out from the solution after approximately 7 hours, and consequently, the reaction mixture was cooled to halt the reaction, yielding a heat-resistant resin filler solution (PIF-2). The thus obtained heat-resistant resin filler was soluble in DMPU.

Example 3

Synthesis of a Solution of a Heat-Resistant Resin Filler (C)

An identical flask to that used in the synthesis example 1 was charged with 96.7 g (0.3 mols) of BTDA, 61.5 g (0.15 mols) of BAPP, 27.0 g (0.135 mols) of DDE, 3.73 g (0.015 mols) of LP-7100, 419.75 g of DMPU, and 22.09 g of γ-BL, and the mixture was then reacted for 8 hours at 70 to 90° C., cooled to halt the reaction, and then allowed to stand for 12 hours, yielding a heat-resistant resin filler solution (PIF-3) comprising a polyimide precursor filler with a number average molecular weight of 26,000. The thus obtained heat-resistant resin filler was soluble in DMPU.

Example 4

Synthesis of a Solution of a Heat-Resistant Resin Filler (C)

An identical flask to that used in the synthesis example 1 was charged with 96.7 g (0.3 mols) of BTDA, 61.5 g (0.15 mols) of BAPP, 27.0 g (0.135 mols) of DDE, 3.73 g (0.015 mols) of LP-7100, 44.19 g of DMPU, and 397.66 g of γ-BL, and when the mixture was stirred for 3 hours at 70 to 90° C., a polyimide precursor filler with a number average molecular weight of 15,000 precipitated out from the solution. Subsequently, the reaction mixture was cooled to halt the reaction, yielding a heat-resistant resin filler solution (PIF-4). The thus obtained heat-resistant resin filler was soluble in DMPU.

Comparative Example 1

With the exception of replacing the reaction solvent from the example 1 comprising 133.25 g of DMPU and 308.59 g of γ-BL with 441.84 g of DMPU, reaction was conducted in exactly the same manner as the example 1, but even when the reaction solution was subsequently left to stand for 30 days, no polyimide precursor filler precipitated out.

Comparative Example 2

An identical flask to that used in the synthesis example 1 was charged with 102.9 g (0.35 mols) of 3,3'4,4'-biphenyltetracarboxylic dianhydride (hereafter abbreviated as BPDA), 70.0 g (0.35 mols) of DDE, and 403.4 g of DMPU, and the mixture was then reacted for 8 hours at 70 to 90° C., subsequently cooled to halt the reaction, and then allowed to stand for 5 days, yielding a heat-resistant resin filler solution comprising a polyimide precursor filler with a number average molecular weight of 30,000.

The synthesis conditions employed, and the results for, the examples 1 to 4 and the comparative examples 1 and 2 are summarized in Table 1.

Moreover, the resin composition obtained was coated onto a Teflon (a registered trademark) substrate, and then heated at 350° C. to dry the organic solvent, thereby forming a coating film with a film thickness of 25 μm. Using a dynamic viscoelasticity spectrometer (manufactured by Iwamoto Seisakusho Co., Ltd.), this coating film was measured for tensile modulus of elasticity (25° C., 10 Hz) and glass transition temperature (frequency: 10 Hz, rate of temperature increase: 2° C./minute).

TABLE 1

| | | | | Example 1 | Example 2 | Example 3 | Example 4 | Comparative example 1 | Comparative example 2 |
|---|---|---|---|---|---|---|---|---|---|
| Synthesis conditions | Monomer composition (mols) | Acid component | BTDA | 1.00 | 1.00 | 1.00 | 1.00 | 1.00 | 1.00 |
| | | Amine component | BAPP | 0.50 | 0.95 | 0.50 | 0.50 | 0.50 | — |
| | | | DDE | 0.45 | — | 0.45 | 0.45 | 0.45 | 1.00 |
| | | | LP-7100 | 0.05 | 0.05 | 0.05 | 0.05 | 0.05 | — |
| | Solvent composition (weight) | DMPU | | 30 | 30 | 95 | 10 | 100 | 100 |
| | | γ-BL | | 70 | 70 | 5 | 90 | — | — |
| | NV quantity following synthesis (weight %) | | | 30 | 30 | 30 | 30 | 30 | 30 |
| Results | Time required for filler precipitation (hours) | | | 5 | 7 | 20 | 3 | No precipitate | 128 |
| | Number average molecular weight of precipitated filler | | | 24,000 | 25,000 | 26,000 | 15,000 | No precipitate | 30,000 |

It is evident that by adopting a heat-resistant resin paste and production method therefor according to the present invention, a heat-resistant resin filler can be produced in a short time period, thereby providing excellent workability.

Example 5

A 1 liter four-necked flask fitted with a thermometer, a stirrer, a nitrogen gas inlet, and a condenser fitted with an oil-water separator was flushed with a nitrogen stream, while the flask was charged with 300 g of the heat-resistant resin solution (PI-1) obtained in the synthesis example, and 400 g of the heat-resistant resin filler solution (PIF-1) obtained in the example 1, and the resulting mixture was stirred for 2 hours at 50 to 70° C., thereby yielding a heat-resistant resin paste (PIP-1) with the heat-resistant resin dissolved therein and with the heat-resistant resin filler dispersed therein.

The viscosity and thixotropic index of the heat-resistant resin paste (PIP-1) obtained in the example 5 were measured at a measurement temperature of 25° C., using an E-type viscometer (RE-80U, manufactured by Tokyo Keiki Co., Ltd.) and a sample size of 0.2 g. The viscosity was measured at 0.5 rpm, whereas the thixotropic index was evaluated by determining the ratio $\eta_1/\eta_{10}$ between the apparent viscosity values $\eta_1$ and $\eta_{10}$ measured at rotation rates of 1 rpm and 10 rpm respectively.

In addition, the heat-resistant resin paste (PIP-1) obtained in the example 5 was also screen printed onto a silicon wafer, using a screen printing device (LS-34GX fitted with an alignment device, manufactured by Newlong Seimitsu Kogyo Co., Ltd.), a meshless metal plate formed from nickel alloy additive plating (manufactured by Nihon Mesh Kogyo Co., Ltd., thickness: 50 μm, pattern dimensions: 8 mm×8 mm), and a Permalex metal squeegee (imported by Tomoe Engineering Co., Ltd.), and the printing characteristics were evaluated.

Following printing, the printed sample was inspected under an optical microscope for blurring and sagging.

Furthermore, the thermal decomposition starting temperature (the 5% weight reduction temperature) was measured using a thermobalance.

The results are shown in Table 2.

Example 6

In the example 5, with the exception of replacing the heat-resistant resin filler solution (PIF-1) obtained in the example 1 with the heat-resistant resin filler solution (PIF-2) obtained in the example 2, exactly the same procedure as the example 5 was used to obtain a heat-resistant resin paste (PIP-2) with the heat-resistant resin dissolved therein and with the heat-resistant resin filler dispersed therein.

Example 7

In the example 5, with the exception of replacing the heat-resistant resin filler solution (PIF-1) obtained in the example 1 with the heat-resistant resin filler solution (PIF-3) obtained in the example 3, exactly the same procedure as the example 5 was used to obtain a heat-resistant resin paste (PIP-3) with the heat-resistant resin dissolved therein and with the heat-resistant resin filler dispersed therein.

Example 8

In the example 5, with the exception of replacing the heat-resistant resin filler solution (PIF-1) obtained in the example 1 with the heat-resistant resin filler solution (PIF-4) obtained in the example 4, exactly the same procedure as the example 5 was used to obtain a heat-resistant resin paste (PIP-4) with the heat-resistant resin dissolved therein and with the heat-resistant resin filler dispersed therein.

Comparative Example 3

In the example 5, with the exception of replacing the heat-resistant resin filler solution (PIF-1) obtained in the example 1 with the solution obtained in the comparative example 1, the same procedure as the example 5 was conducted, yielding a heat-resistant resin solution (PIP-5).

TABLE 2

| | Item | Example 5 | Example 6 | Example 7 | Example 8 | Comparative example 3 |
|---|---|---|---|---|---|---|
| Heat-resistant resin paste | | PIP-1 | PIP-2 | PIP-3 | PIP-4 | PIP-5 |
| Paste characteristics | Viscosity (Pa · s) | 200 | 210 | 210 | 180 | 30 |
| | Thixotropic index | 4.5 | 4.5 | 4.5 | 4.0 | 1.1 |
| | Printing characteristics (presence of blurring or sagging) | No | No | No | No | Yes |
| Coating film characteristics | Tensile modulus of elasticity (MPa) | 3300 | 3400 | 3400 | 3300 | 3300 |
| | Glass transition temperature (° C.) | 260 | 260 | 260 | 240 | 260 |
| | Thermal decomposition starting temperature (° C.) | 490 | 490 | 490 | 480 | 490 |

In addition to the examples described above, a variety of heat-resistant resin pastes can be produced in a short time period by using a first organic solvent and a second organic solvent, and selecting a lactone as the second organic solvent, and in each case, the resulting heat-resistant resin paste exhibits excellent paste characteristics and coating film characteristics. Furthermore, in those cases where a first organic solvent and a second organic solvent are not used, or cases where a lactone is not selected as the second organic solvent, obtaining a paste which exhibits excellent results across all areas, including paste characteristics, coating film characteristics and workability, is impossible.

INDUSTRIAL APPLICABILITY

Figure 2:
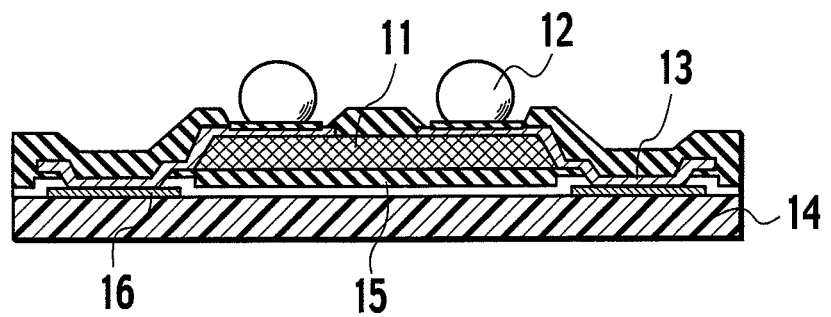
FIG. 2 is a cross-sectional view showing an example of a semiconductor package that uses a heat-resistant resin paste of the present invention as a stress relaxation layer. In the figure, 11 represents the stress relaxation layer, 12 represents a solder ball, 13 represents an electrode, 14 represents a silicon wafer, 15 represents a polyimide-based insulating film, and 16 represents an aluminum pad.

A heat-resistant resin paste of the present invention can be used as a protective film, insulating film, stress relaxation layer, adhesive, or heat-resistant printing ink or the like for a wide variety of devices, including all manner of semiconductor devices, semiconductor packages, thermal heads, image sensors, multi-chip high-density mounting boards, diodes, capacitors and transistors, as well as for a wide variety of wiring boards including flexible wiring boards and rigid wiring boards, and is consequently extremely useful industrially. FIG. 1 shows an example of the use of a paste of the present invention as an insulating film for a diode, and FIG. 2 shows an example of the use of a paste of the present invention as a stress relaxation layer for a semiconductor device.

There are no particular restrictions on the method used for forming a precise pattern using a heat-resistant resin paste of the present invention, and suitable methods include screen printing methods, dispensing methods, potting methods, curtain coating methods, relief printing methods, copperplate printing methods, and planographic printing methods.

The invention claimed is:
1. A heat-resistant resin paste, comprising:
a first organic solvent (A1), wherein the first organic solvent is 1,3-dimethyl-3,4,5,6-tetrahydro-2(1H)-pyrimidinone,
a second organic solvent (A2) that comprises a lactone, wherein the lactone is selected from the group consisting of γ-butyrolactone and γ-valerolactone,
a heat-resistant resin (B) that is soluble in a mixed organic solvent of (A1) and (A2), and
a heat-resistant resin filler (C) that is soluble in (A1) but insoluble in (A2),
wherein
(C) is dispersed within a solution comprising (A1), (A2) and (B),
a quantity of the lactone, relative to a total weight of the second organic solvent (A2), is at least 5% by weight,
a quantity of the heat-resistant resin (B) and the heat-resistant resin filler (C), relative to a total weight of the heat-resistant resin paste, is within a range from 5 to 90% by weight,
the heat-resistant resin (B) comprises a polyimide resin, a polyamideimide resin, a polyamide resin, or a precursor thereto, and
the heat-resistant resin filler (C) comprises a polyimide resin, a polyamideimide resin, a polyamide resin, or a precursor thereto.

2. The heat-resistant resin paste according to claim 1, wherein the heat-resistant resin (B) and/or the heat-resistant resin filler (C) are polyimide resins or precursors thereto.

3. The heat-resistant resin paste according to claim 1, wherein the heat-resistant resin (B) and/or the heat-resistant resin filler (C) is a polyimide resin or precursor thereto obtained by reaction between: a diamine comprising an aromatic diamine represented by a general formula (I) shown below:

[Formula 1]

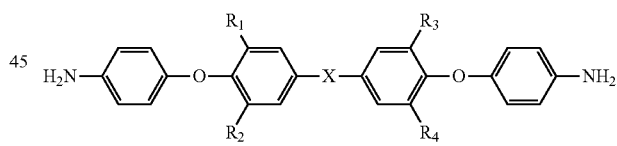

(I)

wherein, R1, R2, R3 and R4 each represent, independently, a hydrogen atom, an alkyl group of 1 to 9 carbon atoms, an alkoxy group of 1 to 9 carbon atoms, or a halogen atom, and X represents a single bond, —O—, —S—, —SO2-, —C(=O)—, —S(=O)—, or a group represented by a formula shown below:

[Formula 2]

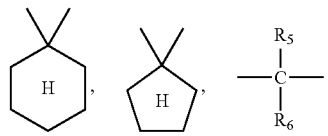

wherein, R5 and R6 each represent, independently, a hydrogen atom, alkyl group, trifluoromethyl group, trichloromethyl group, halogen atom, or phenyl group, and/or a diamine comprising an aromatic diamine represented by a general formula (II) shown below:

[Formula 3]

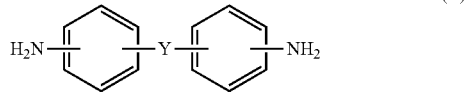

(II)

wherein, Y represents —O—, —C(=O)—, —S(=O)—, or a group represented by a formula shown below:

[Formula 4]

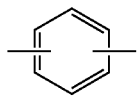

and a tetracarboxylic acid comprising an aromatic tetracarboxylic dianhydride represented by a general formula (111) shown below or a derivative thereof:

[Formula 5]

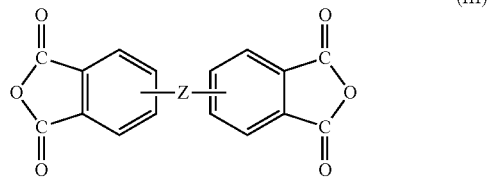

(III)

wherein, Z represents a single bond, —O—, —S—, —SO2-, —C(=O)—, or —S(=O).

4. The heat-resistant resin paste according to claim 1, wherein a thixotropic index of the heat-resistant resin paste is 1.5 or higher.

5. A method for producing the heat-resistant resin paste wherein the heat-resistant resin filler (C) is a filler that is prepared within the second organic solvent (A2) that comprises a lactone according to claim 1.

6. The heat-resistant resin paste according to claim 1 wherein a quantity of the first organic solvent contained in the paste is at least 40% by weight of the combined weight of the first and second organic solvents.

7. The heat-resistant resin paste according to claim 1, wherein a mixing ratio between the heat-resistant resin (B) and the heat-resistant resin filler (C) is 10/90 to 90/10.

8. The heat-resistant resin paste according to claim 1, wherein said heat-resistant resin (B) is insoluble in the second organic solvent (A2) alone.

9. The heat-resistant resin paste according to claim 1, wherein the heat-resistant resin filler (C) is not soluble in a mixture of the first organic solvent (A1) and the second organic solvent (A2).

10. The heat-resistant resin paste according to claim 1, wherein the quantity of the lactone, relative to the total weight of the second organic solvent (A2), is 5 to 95% by weight.

11. The heat-resistant resin paste according to claim 10, wherein said quantity of the lactone is 15 to 85% by weight relative to said total weight of the second organic solvent (A2).

* * * * *